(12) United States Patent
Ranjan

(10) Patent No.: US 6,529,034 B1
(45) Date of Patent: Mar. 4, 2003

(54) INTEGRATED SERIES SCHOTTKY AND FET TO ALLOW NEGATIVE DRAIN VOLTAGE

(75) Inventor: Niraj Ranjan, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/045,451

(22) Filed: Nov. 7, 2001

(51) Int. Cl.[7] .................... H03K 19/013; H01L 31/119

(52) U.S. Cl. .................. 326/19; 326/116; 326/118; 257/337; 327/109

(58) Field of Search .................... 326/88, 116, 118, 326/19; 327/108, 109; 257/337, 339, 492

(56) References Cited

U.S. PATENT DOCUMENTS 4,866,495 A * 9/1989 Kinzer .................. 257/337
5,545,955 A * 8/1996 Wood .................... 315/224

* cited by examiner

*Primary Examiner*—Michael Tokar
*Assistant Examiner*—Vibol Tan
(74) *Attorney, Agent, or Firm*—Ostrolenk, Faber, Gerb & Soffen, LLP

(57) ABSTRACT

A high side driver chip for MOSgated devices which controls a non resistive, or non inductive load has a vertical conduction refresh MOSFET integrated into the chip for connecting a $V_s$ node to ground to discharge the load capacitance. A Schottky diode is also integrated with the refresh MOSFET to prevent forward conduction of a parasitic diode of the vertical conduction MOSFET.

4 Claims, 2 Drawing Sheets

INTEGRATED SERIES SCHOTTKY AND FET TO ALLOW NEGATIVE DRAIN VOLTAGE

FIELD OF THE INVENTION

This invention relates to integrated circuit gate drivers and more particularly to such drivers for driving high side power MOSFETs or IGBTs, and to a novel planar MOSFET and integrated series connected Schottky diode.

BACKGROUND OF THE INVENTION

Integrated circuit MOSFET drivers are well known, for driving the low side and/or high side MOSgated device of a power control circuit. Thus high side drivers are known for controlling the turn on and turn off of a power MOSFET which then permits the connection of electrical power to a load. High side drivers of this kind are known for example, as the IR2015 chip sold by International Rectifier Corporation of El Segundo, Calif.

Such chips will typically consist of a single silicon chip which has a first plurality of control devices integrated in its main body, which is at ground potential, and will also have a second plurality of control devices contained within a high side floating well which is at a high potential relative to ground. The chip will have a number of input pins, including $V_{cc}$ (control voltage), an input control pin, a comm (or ground) pin, all connected to components in the low voltage portion of the referenced to ground.

The output to the gate of high side switch (MOSFET or IGBT) can be at a high voltage, so that the input signal to the input pin must be level shifted up. This is commonly done by circuitry in the floating high side well in the integrated circuit chip. The high side circuit "floats" at the potential of the Vs pin, which is normally connected to the source of the high side switch (MOSFET or IGBT). The output pin HO is connected to the gate of the high side switch to be driven and it provides the drive signal. The voltage difference between the voltages on the Vb and Vs pin provides the supply for the floating high side circuit within the integrated circuit. There are many ways in which the Vbs floating supply can be generated; the bootstrap technique being the simplest and least expensive. In this technique the supply is formed by a high voltage diode and capacitor as shown in FIG. 1 to be later described in detail. This invention is primarily aimed at applications in which the bootstrap technique is used.

When Vs in FIG. 1 is at ground potential the bootstrap capacitor 36 is charged through the bootstrap diode 35 from the 15V Vcc supply. Once this capacitor is fully charged, it retains its charge even when the Vs pin floats to a high voltage, because the bootstrap diode 35 becomes reversed biased. The bootstrap capacitor 36 provides supply current for the high side circuit as well as the gate charge necessary to turn ON the external MOSFET to be driven. However, the bootstrap capacitor 36 must be refreshed by some means before it is discharged significantly.

If the high side switch drives a resistive or inductive load, the bootstrap capacitor 36 is easily refreshed by simply turning the switch off periodically and waiting for the Vs potential to drop to ground (Comm) potential through the load. Once the Vb potential reduces to 0.7V below Vcc the bootstrap diode 35 conducts and re-charges the bootstrap capacitor.

Additionally, in a half bridge circuit the bootstrap capacitor 36 is charged by turning the high side switch (MOSFET or IGBT) off and turning the low side switch (MOSFET or IGBT) on, thus connecting Vs to ground. If the Vb potential is significantly below Vcc the bootstrap diode conducts and refreshes the capacitor.

In absence of resistive (or inductive) loads or a synchronized low side switch, the Vs potential may not automatically drop to ground potential when the high side switch is turned off. In this situation it is desirable to add an internal high voltage MOSFET to the gate driver IC which will connect Vs to ground in order to refresh bootstrap capacitor 36. It was found, however, that such an added transistor could not meet the (−)Vs condition which is often experienced in many applications where Vs goes a few volts below ground potential. During such (−)Vs excursions the inherent drain to body diode of the refresh transistor conducts in its forward conduction direction, generating minority carriers. These minority carriers are injected into the control circuit, and some are collected in the high side floating well and by nearby level shift FET drain regions. This results in small amount of drain current, resulting in malfunction of R-S latch used in level shift circuits [see U.S. Pat. No. 5,545,955 (Wood) for such level shift circuits]. Therefore, the output state of the HO pin can change from low to high (or vice versa) without any input signal.

It would be desirable to provide a means to refresh a bootstrap capacitor in the absence of resistive/inductive loads without danger of producing false control signals. It is also desirable in many application of MOSFETs in general, to prevent conduction of its parasitic diode under forward bias and to prevent injection of minority carriers into nearby control circuits.

In accordance with this invention, a Schottky diode is placed in series with the internal high voltage MOSFET which is used to connect Vs pin to ground in order to refresh the bootstrap capacitor. The refresh transistor and the Schottky can be integrated into the chip and the Schottky device can be formed in series with the drain of refresh transistor.

BRIEF SUMMARY OF THE INVENTION

The novel of the Schottky operates to add an approximately 0.5 volt drop to the $V_{DS(ON)}$ of the refresh transistor during its on state. However, in the reverse direction, the blocking voltage is increased from (−)0.5 volts to up to about (−)8 volts. Thus, the device body diode does not conduct when $V_s$ goes to $(-)v_c$ when the body to drain diode would have otherwise started to conduct and inject minority carriers into the high side well.

A novel high voltage FET and Schottky diode is also formed by a novel process in which the vertical conduction FET is a lateral device, and the drain (or source) is connected to N⁻ silicon to define the Schottky.

DETAILED DESCRIPTION OF THE DRAWINGS

DETAILED DESCRIPTION OF THE DRAWINGS

Figure 1:
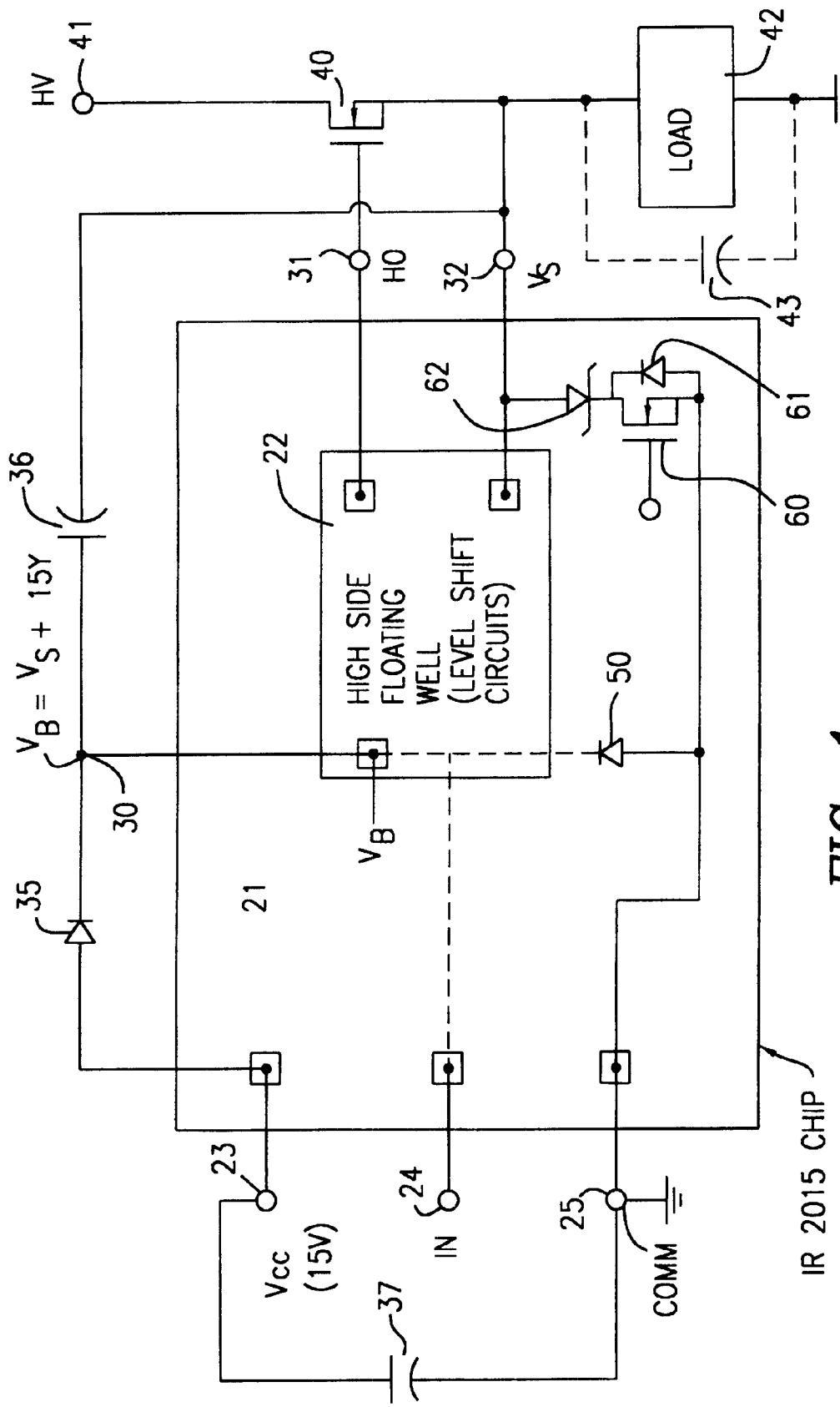
FIG. 1 is a schematic block and circuit diagram of a high side integrated circuit chip and a load circuit therefore in which the novel refresh transistor and Schottky are integrated into the chip.

FIG. 1 shows relevant portions of a high side driver chip 20 such as the IR2015 chip which has a low voltage section 21 and a high side floating well 22. The low voltage section has pins 23, 24 and 25 which are $V_{cc}$ (15 volts), an input signal pin, and a comm (ground) respectively. The high side floating well has pins 30, 31 and 32, which are the $V_B$ pin which is at (+)$v_c$ of a floating power supply, the HO output pin and the $V_s$ pin which is at (−)$v_c$ of the floating power supply and, for example, swings between 0 and 200 volts relative to ground. The voltage $V_B$ at pin 30 is for example, set at ($V_B$=$V_s$+15 volts). The potential of COMM pin 25 is typically the same as the return terminal for the load.

A boot strap diode 35 is connected between $V_{cc}$ pin 23 and $V_B$ pin 30 and boot strap capacitor 36 is connected between $V_B$ pin 30 and $V_s$ pin 30. A bipass capacitor 37 is connected between $V_{cc}$ pin 23 and COMM 25.

The main MOSgated device is shown as a power MOSFET 40 connected to a high voltage power pin 41 and to a load 42. Load 42 may be any type of load which may be controlled as by pulse frequency modulation of the MOSFET 40 under control of chip 20 and the input signal at pin 21.

If load 42 is not resistive or inductive, it would be desirable to provide a refresh transistor to re-charge the bootstrap capacitor 36 by connecting pin 32 to pin 25 (COMM). However, in the circuit described Vs can go a few volts below Comm momentarily. When this occurs the body to drain diode of the refresh transistor becomes forward biased and injects minority carriers into the control circuit, causing malfunction or even destructive latch-up failure.

The boot strap capacitor charge must be refreshed through diode 35 from $V_{cc}$. Thus, $V_B$ must be below $V_{cc}$ for capacitor 36 to be charged. If $V_B$ goes higher than $V_{cc}$ capacitor 36 will not discharge due to the blocking action of diode 35. However, capacitor 36 will tend to discharge and must be charged or refreshed. Note that the circuit to charge capacitor 36 includes the series circuit of bipass capacitor 37 (15 volts); $V_{cc}$ pin 23; diode 35; $V_B$ capacitor 36; $V_s$ pin 32; and back to COMM pin 25.

If the load 42 is resistive or inductive, the refresh transistor is not needed at all because the bootstrap capacitor 36 can be refreshed by simply turning the MOSFET 40 off. The load itself will then connect the Vs pin to the ground potential, thereby causing the Vb potential to reach almost the Vcc potential through the conduction of bootstrap diode 35. However, if the load 42 is capacitive, for example, or is otherwise not resistive or inductive, the node Vs will not go immediately to ground potential when MOSFET 40 is turned off. Therefore the bootstrap capacitor will not be refreshed as needed.

If load 42 is resistive or inductive the novel structure of the invention is not needed because $V_s$ pin 32 will not go negative when the main MOSFET 40 turns off and bootstrap capacitor 36 will be refreshed. That is, since $V_s$ is at zero if $V_B$ goes lower than $V_{cc}$, diode 35 will conduct after the diode forward drop is exceeded. However, if load 42 is, for example, capacitive, the node at $V_s$ will not go immediately to zero volts when the MOSFET 40 turns off. Therefore, the bootstrap capacitor will not be refreshed as needed.

To solve this problem and to insure the continuous refreshing of boot strap capacitor 36 a vertical conduction refresh MOSFET 60 is added to the circuit of FIG. 1, either as a discrete part, or integrated into silicon 21, and is connected from $V_s$ to comm. The purpose of MOSFET 60 is to bring $V_s$ close to $v_{COMM}$. When the main MOSgated device 40 (a Power MOSFET or IGBT) now turns off, the potential at pin 32 can be suitably connected to ground by turning MOFSET 60 on. However, MOSFET 60 has a parasitic diode 61 and this diode will turn on as soon as $V_s$ goes below about (−) 0.5 volt and minority carriers will then be injected into the control circuits.

In accordance with the invention, a Schottky diode 62 is connected in series with MOSFET 60 in a direction to block forward conduction of its parasitic diode 61. The addition of Schottky 62 slightly increases the on resistant of the MOSFET 60 circuit, but, when the MOSFET 60 and Schottky 62 are integrated into the chip 20, minority carriers are not injected into the control circuit when the Vs node (pin 32) goes a few volts below COMM (pin 25).

Figure 2:
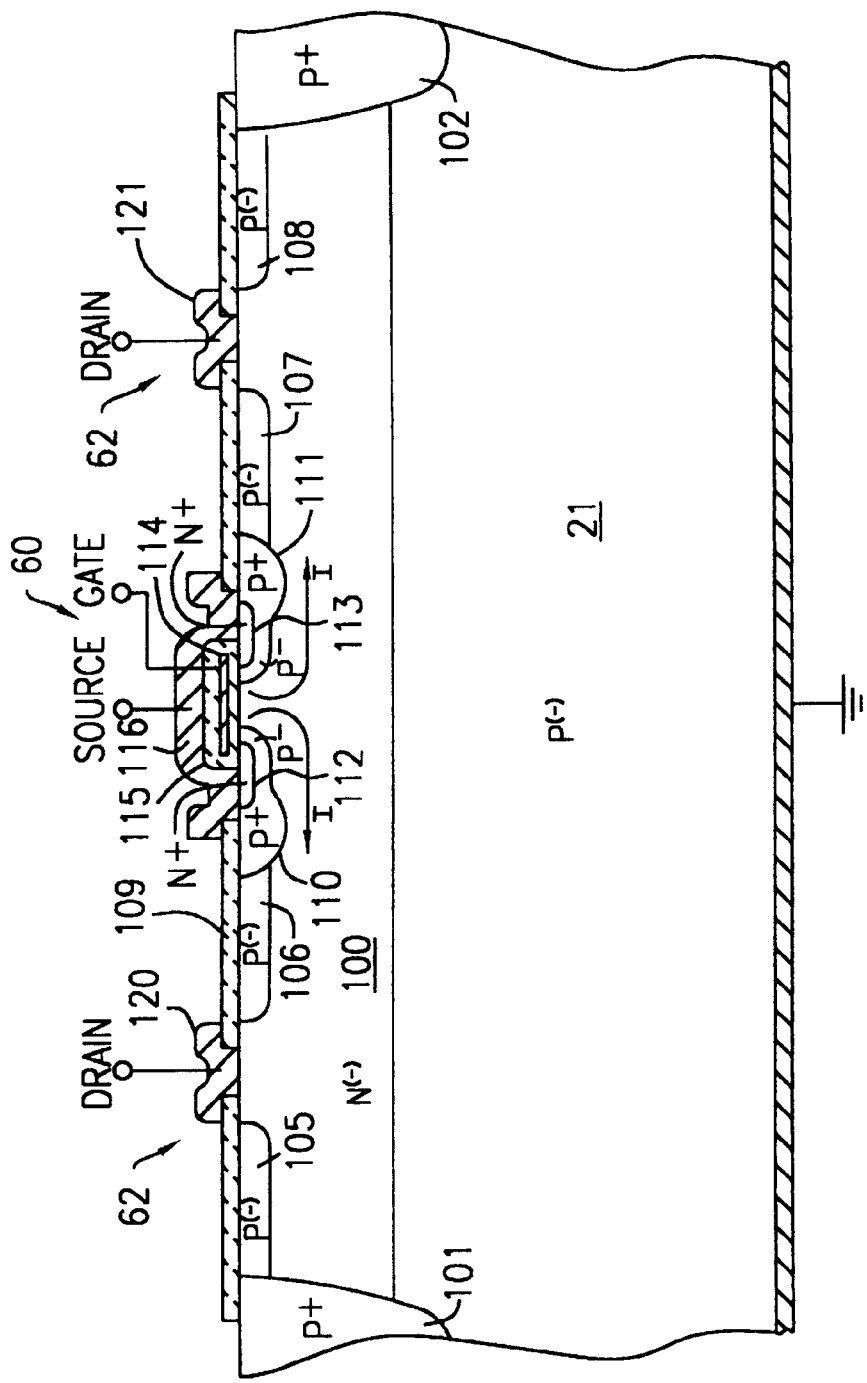
FIG. 2 is a cross-section of a portion of the novel refresh transistor and integrated Schottky.

FIG. 2 shows one embodiment of the refresh MOSFET 60 and Schottky 62. More specifically, the device of FIG. 2 is the same as the lateral MOSFET transistor for a high side switch shown in U.S. Pat. No. 4,866,495, except that the N+ contacts for the drain connections are removed so that a Schottky contact is made to N⁻ silicon. Thus, FIG. 2 shows the chip area 21 as a P⁻ region with an N⁻ epitaxial layer 100 thereon. The region 21 is separated from the high side floating well and/or other components by P⁺ sinkers 101 and 102. P⁻ resurf diffusions 105, 106, 107 and 108 are formed in the chip upper surface and a field oxide 109. Spaced P⁻ channel diffusions with deepened P⁺ regions 110 and 111 contain respective N⁺ source regions 112 and 113 and are covered by a gate oxide and a polysilicon gate 114. The conductive gate 114 is insulated by an interlayer oxide 115 from the source electrode 116. The drain contacts 120 and 121 are connected directly to N⁻ silicon 100, rather than to N⁺ contact regions as in U.S. Pat. No. 4,866,495. The drain contacts, like source contact 116 are of aluminum, and will form a novel Schottky connection to the N⁻ silicon 100 to define Schottky device 62.

In operation, when the MOSFET 60 is turned on by a signal on gate 114, currents I will flow as shown, through N⁻ epi 100 and under the channel areas, to Schottky drain contacts 120 and 121.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A driver for a MOSgated transistor; said driver having a signal input pin, a ground pin, a single output pin and a $V_s$ pin connectable to the node between the MOSgated transistor and a load, and level shift circuit for translating input signals to said signal input pin to said signal output pin; and a vertical conduction refresh MOSFET having an inherent parasitic diode and a Schottky diode connected in a series with one another and connected between said $V_s$ pin and ground pin; said Schottky diode being oppositely poled to the parasitic diode of said refresh MOSFET.

2. The driver of claim 1, wherein said driver is an integrated circuit in a common silicon chip; said silicon chip having a low voltage area and a high side floating well; said level shift circuit being integrated into said floating well; said refresh MOSFET and Schottky diode being integrated into said low voltage area.

3. The driver of claim 1, wherein said MOSgated transistor is connected in series with a non-resistive, non-inductive load; said refresh MOSFET being turned on when said MOSgated device is turned off, whereby the charge on said load, is discharged through said refresh MOSgated device.

4. The driver of claim 2, wherein said MOSgated transistor is connected in series with a non-resistive, non-induction load; said refresh MOSFET being turned on when said MOSgated device is turned off, whereby the charge on said load, is discharged through said refresh MOSgated device.

* * * * *